(12) United States Patent
Yen et al.

(10) Patent No.: US 11,569,419 B2
(45) Date of Patent: Jan. 31, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chen-En Yen, Changhua County (TW); Ming-Da Cheng, Taoyuan (TW); Mirng-Ji Lii, Hsinchu County (TW); Wen-Hsiung Lu, Tainan (TW); Cheng-Jen Lin, Kaohsiung (TW); Chin-Wei Kang, Tainan (TW); Chang-Jung Hsueh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 190 days.

(21) Appl. No.: 17/084,637

(22) Filed: Oct. 30, 2020

(65) Prior Publication Data
US 2022/0140197 A1    May 5, 2022

(51) Int. Cl.
| | | |
|---|---|---|
| H01L 33/42 | (2010.01) | |
| H01L 23/522 | (2006.01) | |
| H01L 27/24 | (2006.01) | |
| H01L 33/60 | (2010.01) | |
| H01L 33/62 | (2010.01) | |
| H01L 27/32 | (2006.01) | |
| H01L 45/00 | (2006.01) | |

(52) U.S. Cl.
CPC .......... *H01L 33/42* (2013.01); *H01L 23/5223* (2013.01); *H01L 23/5226* (2013.01); *H01L 27/2463* (2013.01); *H01L 33/60* (2013.01); *H01L 33/62* (2013.01)

(58) Field of Classification Search
CPC . H01L 33/42; H01L 23/5223; H01L 23/5226; H01L 45/1253; H01L 27/2436
See application file for complete search history.

(56) References Cited

U.S. PATENT DOCUMENTS

2018/0351099 A1* 12/2018 Yang .................... H01L 27/2436

* cited by examiner

*Primary Examiner* — Marcos D. Pizarro
*Assistant Examiner* — Antonio B Grite
(74) *Attorney, Agent, or Firm* — JCIPRNET

(57) ABSTRACT

A semiconductor device and a manufacturing method thereof are provided. The semiconductor device includes a semiconductor substrate, active devices and transparent conductive patterns. The active devices are formed on the semiconductor substrate. The transparent conductive patterns are formed over the active devices and electrically connected to the active devices. The transparent conductive patterns are made of a metal oxide material. The metal oxide material has a first crystalline phase with a prefer growth plane rich in oxygen vacancy, and has a second crystalline phase with a prefer growth plane poor in oxygen vacancy.

20 Claims, 14 Drawing Sheets

SEMICONDUCTOR DEVICE AND MANUFACTURING METHOD THEREOF

BACKGROUND

In recent years, conductive/semi-conductive metal oxides have been widely used in various applications including optoelectronic devices and memory devices. Integrating the optoelectronic devices or the memory devices with complementary metal-oxide semiconductor (CMOS) technology provides a preferable choice for minimization and multi-functionality. However, the combination of the optoelectronic devices or the memory devices with CMOS technology results in increase of complexity in manufacturing process, and reliability of the optoelectronic device may be compromised.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
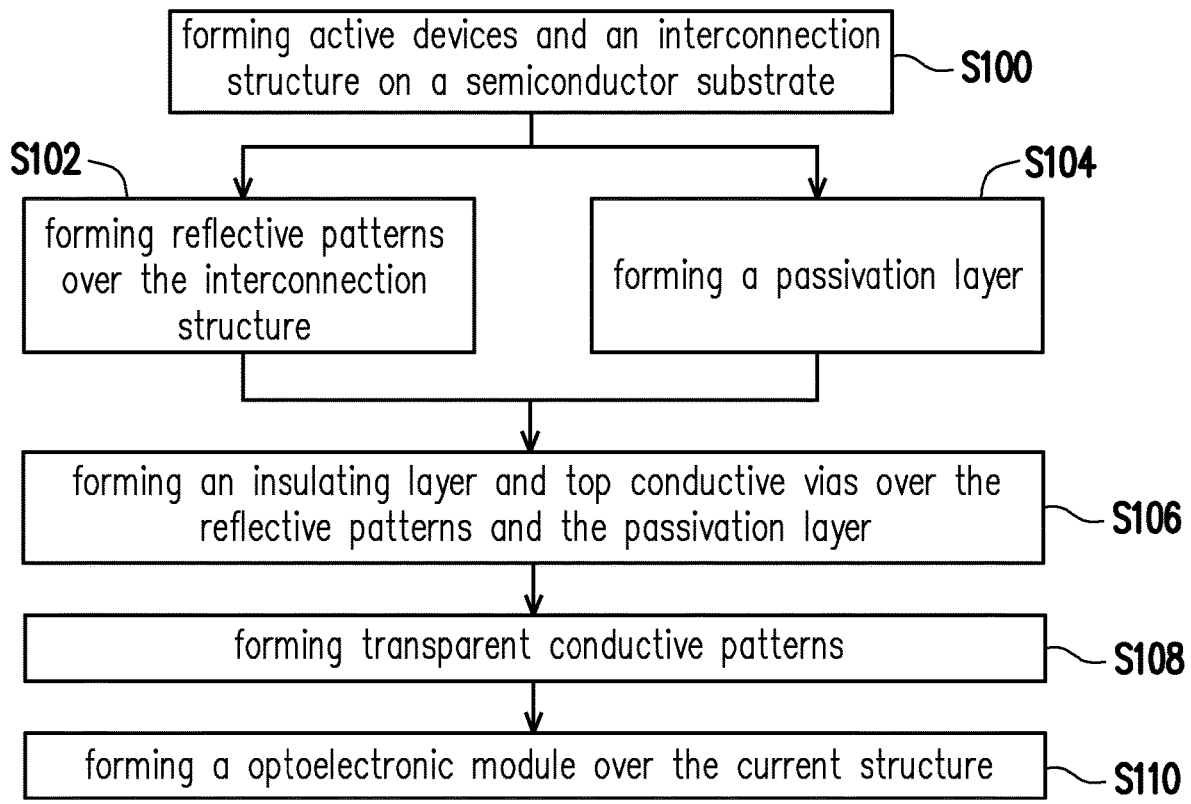
FIG. 1 is a flow diagram illustrating a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 is a flow diagram illustrating a manufacturing method of a semiconductor device 10 according to some embodiments of the present disclosure. FIG. 2A through FIG. 2I include schematic cross-sectional views illustrating structures at various stages during the manufacturing method of the semiconductor device 10 as shown in FIG. 1. FIG. 3A through FIG. 3D are schematic top views illustrating some components in FIG. 2B, FIG. 2D, FIG. 2E and FIG. 2F, respectively.

Figure 2A:
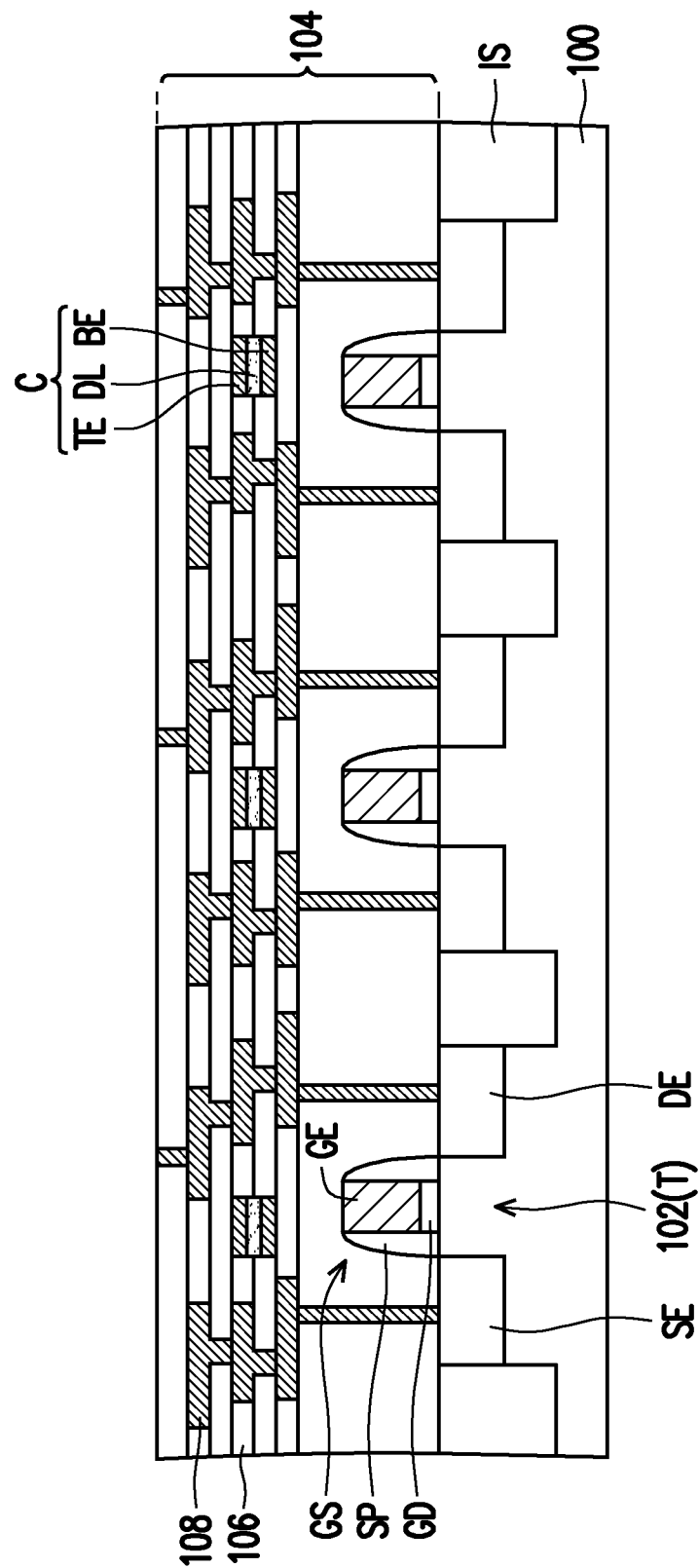
FIG. 2A through FIG. 2F are schematic cross-sectional views illustrating structures at various stages during the manufacturing method of the semiconductor device as shown in FIG. 1.
Figure 2B:
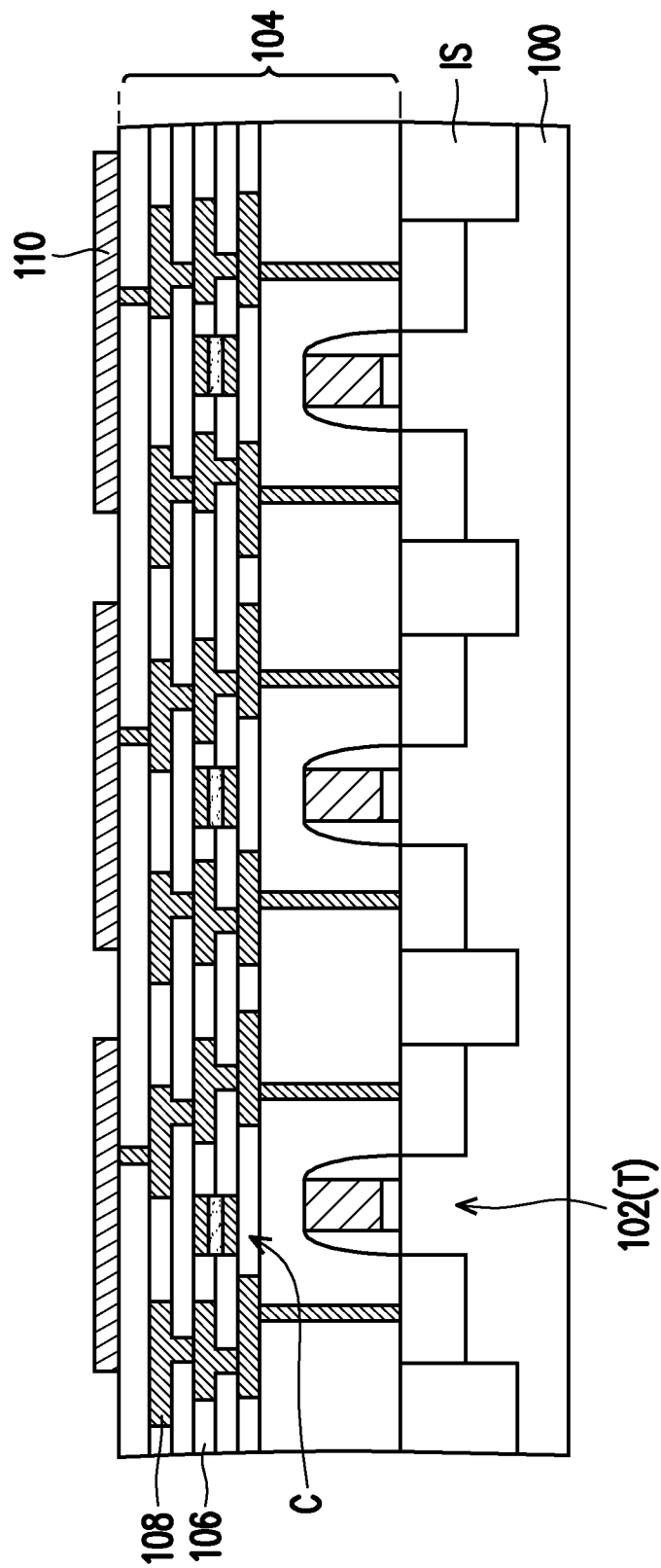
Figure 2C:
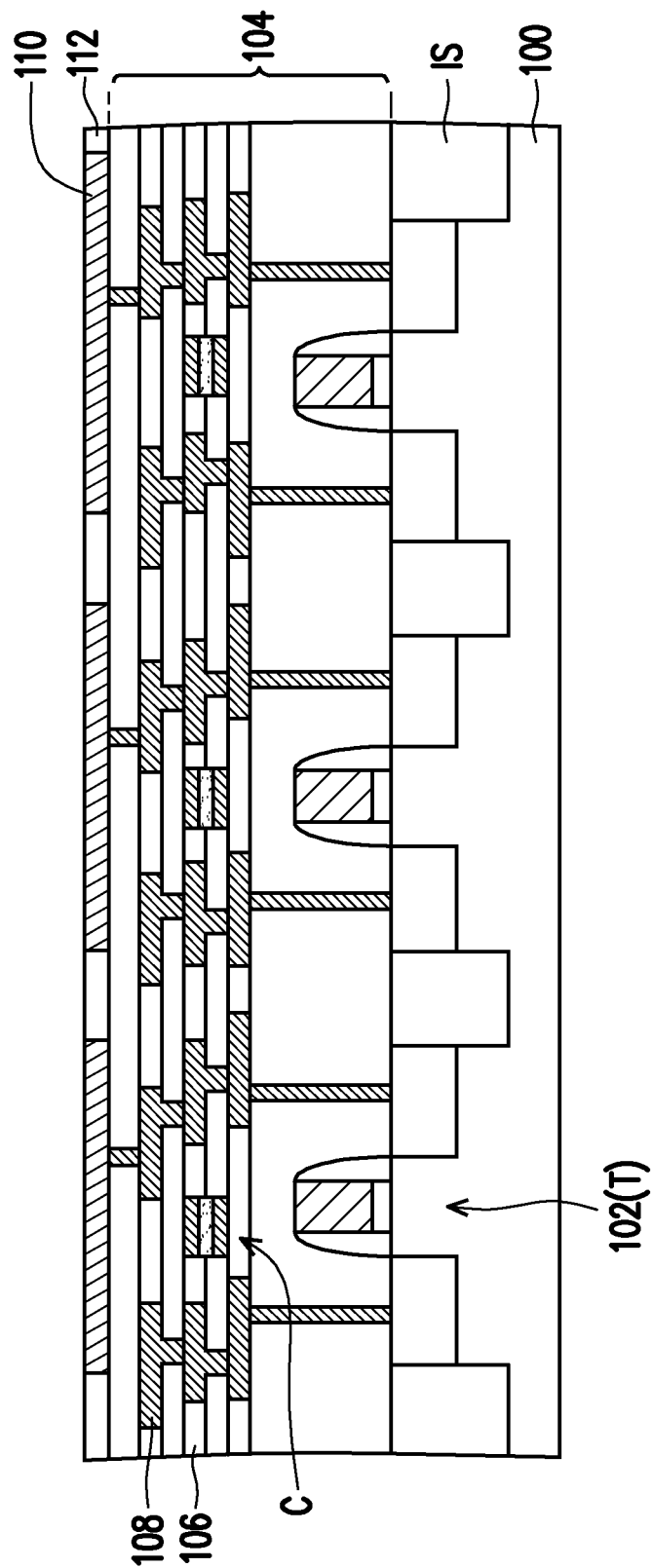
Figure 2D:
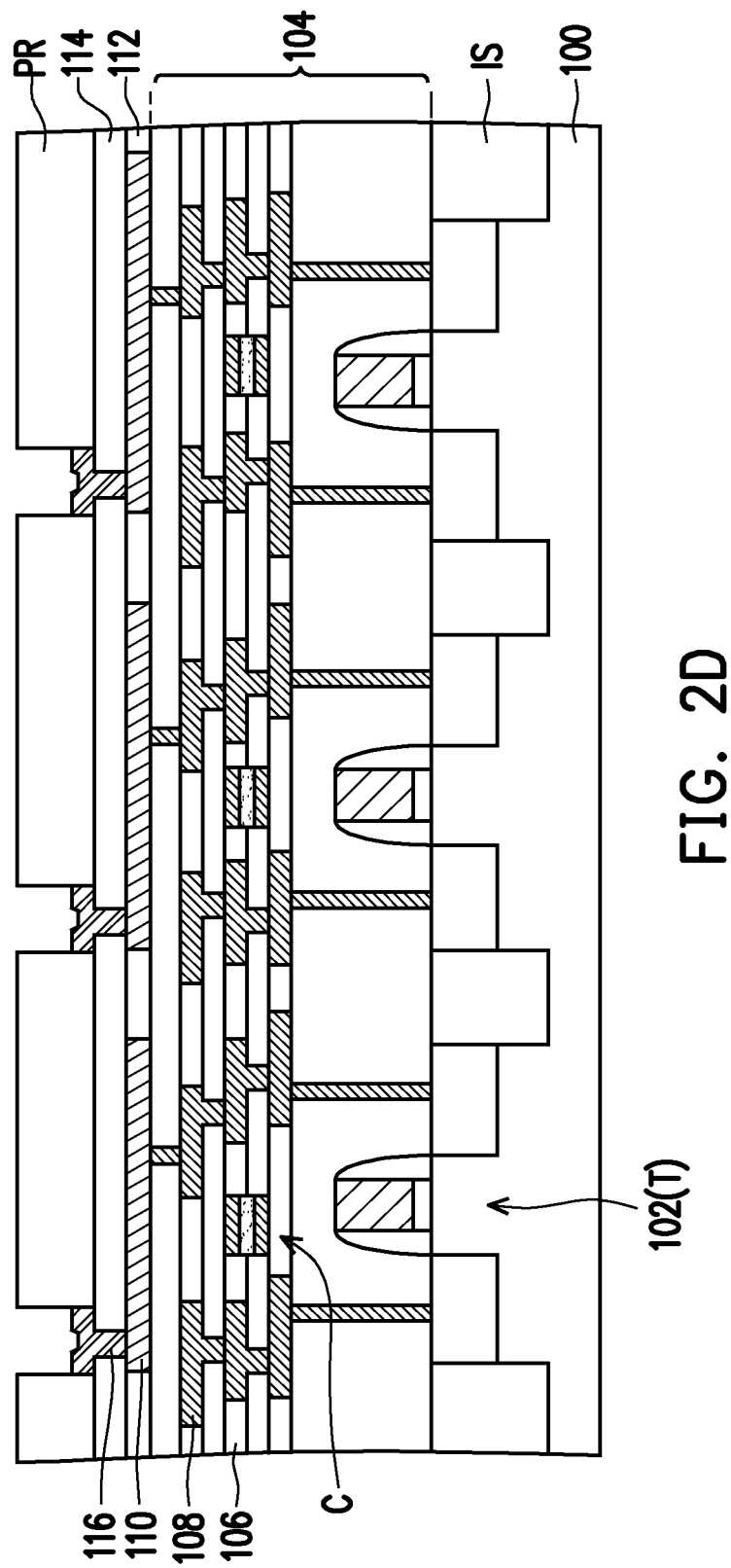
Figure 2E:
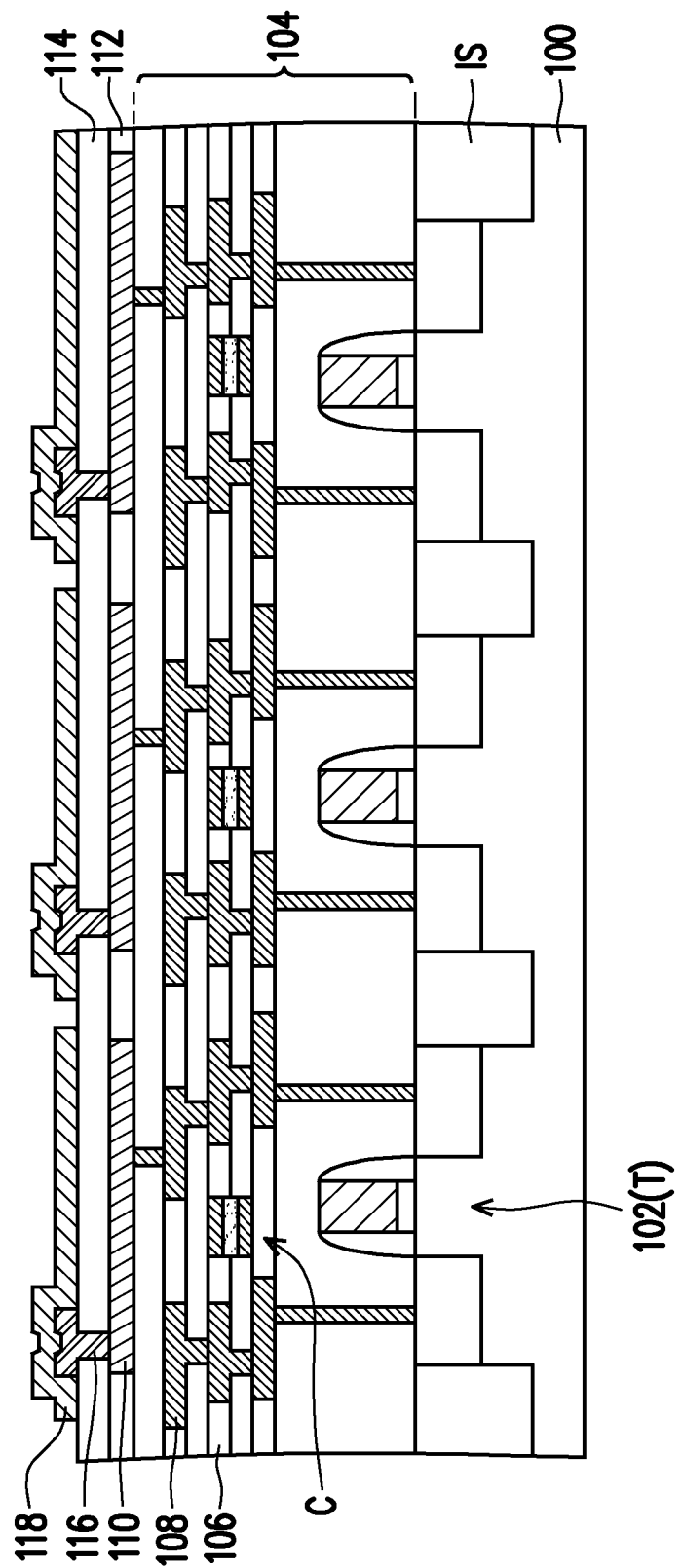
Figure 2F:
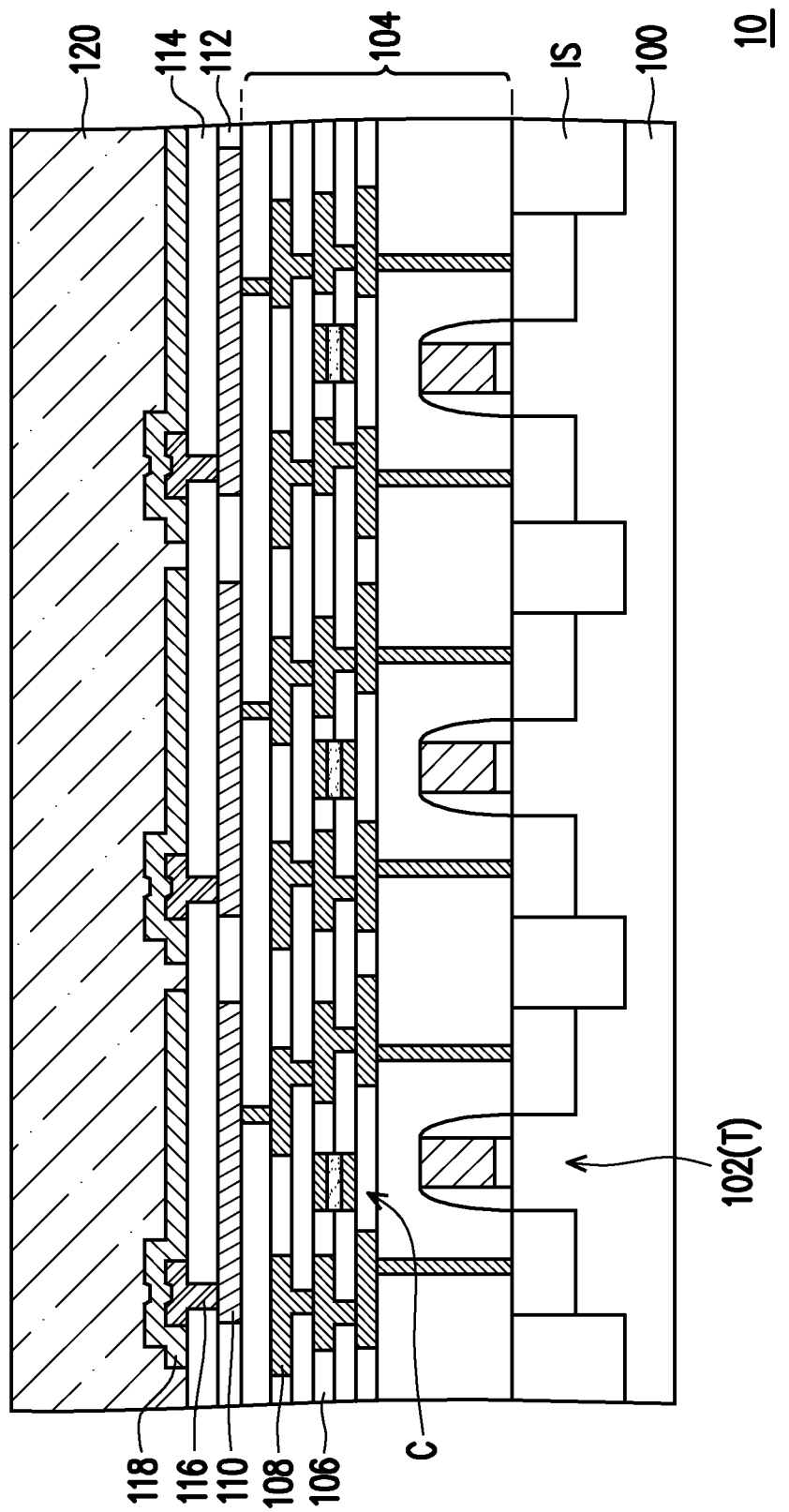

The semiconductor device 10 as shown in FIG. 2F could be regarded as a device wafer including a semiconductor substrate as well as optoelectronic devices and a driving circuit integrated on the semiconductor substrate. In some embodiments, the manufacturing method of the semiconductor device 10 includes the following steps.

Referring to FIG. 1 and FIG. 2A, step S100 is performed, and active devices 102 and an interconnection structure 104 are formed on a semiconductor substrate 100. In some embodiments, the semiconductor substrate 100 is a semiconductor wafer or a semiconductor-on-insulator (SOI) wafer. A semiconductor material of the semiconductor substrate 100 may include a group IV semiconductor material, a group III-V semiconductor material or the like. For instance, the group IV semiconductor material may be Si, Ge, SiGe, SiC, SiGe doped with carbon, the like or combinations thereof. The group III-V semiconductor material may include GaAs, InAs, InGaAs, InP, GaP, GaN, the like or combinations thereof. In addition, the semiconductor substrate 100 may be doped to have a first conductive type (e.g., p type) or a second conductive type (e.g., n type) complementary to the first conductive type. In some embodiments, an isolation structure IS and well regions (not shown) may be formed in the semiconductor substrate 100. The well regions are formed by performing an ion implantation process on the semiconductor substrate 100, and may be functioned as active regions of the active devices 102 formed in and/or over the semiconductor substrate 100. Each of the well regions may have the first conductive type or the second conductive type. All of the well regions may have the same conductive type, or some of the well regions may have a conductive type different from a conductive type of other well regions.

The isolation structure IS laterally surrounds each of the well regions, for isolating the well regions from one another. For instance, the isolation structure IS may be a shallow trench isolation (STI) structure or a deep trench isolation (DTI) structure. The isolation structure IS is made of an insulating material, such as silicon oxide, silicon nitride, silicon oxynitride, the like or combinations thereof. In addition, a formation method of the isolation structure IS may include performing an etching process on the semiconductor substrate 100 to form a trench at a surface of the semiconductor substrate 100, and then filling the insulating material in the recess via a deposition process (e.g., a chemical vapor deposition (CVD) process). Although the isolation structure IS is depicted in FIG. 2A as having separated portions, these portions may be connected with one another, to form a continuous structure. Alternately, the isolation structure IS has separated portions.

The active devices 102 may include transistors for driving the electroluminescence devices to be formed in the following steps (e.g., the electroluminescence devices in the optoelectronic module 120 to be described with reference to FIG. 2F). For instance, the active devices 102 may include metal-oxide-semiconductor (MOS) transistors T. Each of the optoelectronic devices may be respectively driven by one or more of the MOS transistors T. The MOS transistors T respectively include a gate structure GS, a source electrode SE and a drain electrode DE. The gate structure GS covers a portion of the active region (i.e., the well region) of the MOS transistor T, and the source and drain electrodes SE, DE are located at opposite sides of this portion of the active region. Locations of the source and drain electrodes SE, DE can be reversed. A conductive path for electrically connecting the source and drain electrodes SE, DE under the gate structure GS may be formed in this portion of the active region when the MOS transistor T is turned on, and this conductive path may be cut off when the MOS transistor T is in an off state. As shown in FIG. 2A, in some embodiments, the MOS transistor T is a planar type MOS transistor, and only a top surface of the active region is covered by the gate structure GS. The gate structure GS may include a gate electrode GE and a gate dielectric layer GD sandwiched between the gate electrode GE and the active region, and may further include a spacer SP laterally surrounding the gate electrode GE and the gate dielectric layer GD. The gate electrode GE may include one or more work function layers (not shown) lining on surfaces of a recess defined (i.e., laterally surrounded) by the spacer SP and the gate dielectric layer GD, and include a conductive material (also not shown) covering the work function layer(s) and filling up the recess. In addition, the source and drain electrodes SE, DE may be doped regions in the semiconductor substrate 100. Alternatively, the source and drain electrodes SE, DE are epitaxial structures formed in recesses at a surface of the semiconductor substrate 100. In other embodiments, the MOS transistor T is a fin type MOS transistor (or referred as a fin-type field effect transistor (finFET)). In these embodiments, the active region of the fin type MOS transistor may be shaped into a strip shape (or referred as fin shape), and the top surface and opposite sidewalls of this active region may be covered by the gate structure GS. Moreover, the source and drain electrodes SE, DE may be epitaxial structures formed in recesses of the stripe-shaped active region located at opposite sides of the gate structures GS. Furthermore, in some embodiments, the active devices 102 may further include other circuit elements (not shown, such as decoder(s), shift register(s), page buffer(s) or so forth) for controlling the MOS transistors T.

In some embodiments, the interconnection structure 104 includes a stack of dielectric layers 106 and interconnection elements 108 formed in the stack of dielectric layers 106. The interconnection elements 108 are electrically connected to the active devices 102. A bottommost one of the dielectric layers 106 covers the semiconductor substrate 100 and the active devices 102. Bottommost interconnection elements 108 vertically penetrate through the bottommost dielectric layer 106, and are in electrical contact with the source or drain electrodes SE, DE of the active devices 102. These bottommost interconnection elements 108 may be referred as contact plugs. Other interconnection elements 108 formed in dielectric layers 106 above the bottommost dielectric layer 106 are electrically connected to the contact plugs, and may include conductive traces and conductive vias. Each conductive trace extends along a top surface of one of these dielectric layers 106, whereas each conductive via penetrate one of these dielectric layers 106 and electrically connects to one or more of the conductive traces. In some embodiments, topmost interconnection elements 108 are conductive vias, and have top surfaces substantially coplanar with a top surface of a topmost dielectric layer 106. The topmost conductive vias are configured to electrically connect to the subsequently formed electroluminescence devices (e.g., the electroluminescence devices in the optoelectronic module 120 to be described with reference to FIG. 2F). In some embodiments, a formation method of the interconnection structure 104 may include one or more damascene process (e.g., a single damascene process or a dual damascene process), which respectively include a planarization process performed on a conductive material for forming a portion of the interconnection elements 108. For instance, the planarization process may include a chemical mechanical polishing (CMP) process, an etching process or a combination thereof. In some embodiments, the conductive material of the interconnection elements 108 includes W, Ta, TaN, WN, Ti, Cu, the like or combinations thereof, and a method for forming the conductive material may include a physical vapor deposition (PVD) process, a plating process (e.g., an electroplating process or an electroless plating process). In addition, in some embodiments, a dielectric material of the dielectric layers 106 may include silicon oxide, silicon nitride, silicon oxynitride, a low k dielectric material (e.g., a dielectric material having dielectric constant less than 3.5 or 4) or combinations thereof, and a method for forming the dielectric layer may include a chemical vapor deposition (CVD) process.

In some embodiments, some passive devices are formed in the interconnection structure 104. For instance, the passive devices may include capacitors C. The capacitors C may respectively include two separated electrodes BE, TE, and include a dielectric material DL located between these two electrodes. In some embodiments, the interconnection elements 108 may further include conductive patches functioned as the electrodes BE, TE of the capacitors C. In addition, some portions of the dielectric layers 106 are sandwiched between the electrodes, and may be functioned as the dielectric materials DL of the capacitors C. Alternatively, these portions of the dielectric layers 106 may be replaced by a high k dielectric material (e.g., a dielectric material having dielectric constant greater than 8). The capacitor C may have a parallel-plate configuration, an interleaved configuration or other suitable configurations, the present disclosure in not limited to the structure of the capacitor C. In some embodiments, the capacitors C are respectively in electrical contact with one or more of the active devices 102. For instance, one of the capacitors C may be electrically connected to a source or drain electrode SE, DE of one of the active devices 102 and a gate structure GS of another one of the active devices 102. In addition, the capacitors C may further be electrically connected to the subsequently formed electroluminescence devices (e.g., the electroluminescence devices in the optoelectronic module 120 to be described with reference to FIG. 2F) or other interconnection elements 108 (e.g., one of the interconnection elements 108 functioned as a ground line/plane or a data line).

Figure 3A:
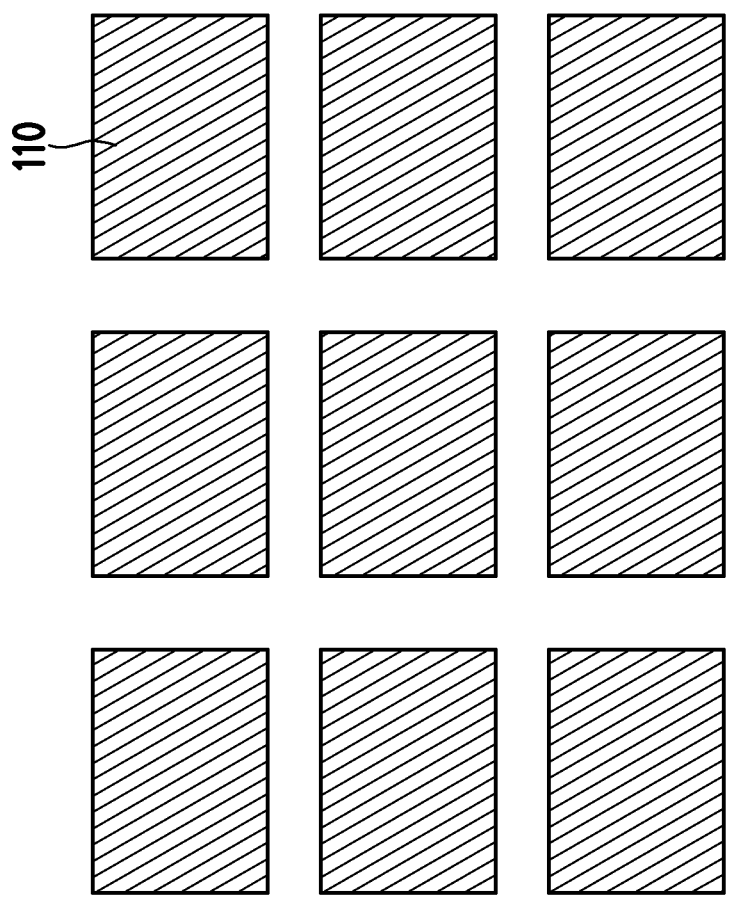
FIG. 3A through FIG. 3C are schematic top views illustrating some components in FIG. 2B, FIG. 2D and FIG. 2E, respectively.

Referring to FIG. 1, FIG. 2B and FIG. 3A, in those embodiments where the subsequently formed electroluminescence devices (e.g., the electroluminescence devices in the optoelectronic module 120 to be described with reference to FIG. 2F) are light emitting devices, step S102 is performed, and reflective patterns 110 are formed over the interconnection structure 104. The reflective patterns 110 are configured to reflect the light produced by the subsequently formed light emitting devices, such that the light can be directed toward a direction leaving top surfaces of the reflective patterns 110. In addition, the reflective patterns 110 are electrically conductive, so as to transmit driving signals to the light emitting devices. In some embodiments, the reflective patterns 110 are laterally separated from one another, and each electrically connected between one of the topmost interconnection elements 108 (i.e., the topmost conductive vias) and one of the light emitting devices. In these embodiments, driving signals could be respectively provided to one of these light emitting devices through the corresponding reflective pattern 110. In addition, in these embodiments, pixel regions may be respectively defined within a span of one of the reflective patterns 110. As shown FIG. 3A, in some embodiments, the reflective patterns 110 are formed as patches (e.g., rectangular patches), and are arranged in an array. These reflective patterns 110 may have a substantially identical footprint area. Alternately, at least one of these reflective patterns 110 has a footprint area different from a footprint area of another one of these reflective patterns 110. Those skilled in the art may modify dimensions, shapes and arrangement of the reflective patterns 110 according to process requirements, the present disclosure is not limited thereto. As described, a material of the reflective patterns 110 should be optically reflective and electrically conductive. For instance, the material of the reflective patterns 110 may include a metal material, such as silver, silver alloy, aluminum, aluminum alloy, the like or combinations thereof. In some embodiments, a method for forming the reflective patterns 110 may include initially forming a mask layer (not shown, such as a photoresist layer) on the interconnection structure 104. The mask layer has openings for defining locations of the reflective patterns 110. Thereafter, the optically reflective and electrically conductive material is filled into these openings to a predetermined thickness by, for example, a PVD process, a plating process (e.g., an electroplating process or an electroless plating process) or a combination thereof, for forming the reflective patterns 110. Once the reflective patterns 110 have been formed, the mask layer may be removed by, for example, a stripping process or an ashing process. In those embodiments where the material for forming the reflective patterns 110 is filled by using a plating process, a seed layer may be formed on the interconnection structure 104 before the formation of the mask layer, and portions of the seed layer covered by the mask layer may be removed along with the mask layer. Alternatively, a method for forming the reflective patterns 110 may include initially forming a reflective material layer (not shown) globally covering the interconnection structure 104, and then patterning the reflective material layer to form the reflective patterns 110 by a lithography process and an etching process.

Referring to FIG. 1 and FIG. 2C, step S104 is performed, and a passivation layer 112 is formed. The passivation layer 112 is formed on the interconnection structure 104, and laterally surrounds the reflective patterns 110. The reflective patterns 110 may be regarded as being located in the passivation layer 112. A material of the passivation layer 112 may include an insulating material, such as silicon oxide, silicon nitride, silicon oxynitride, the like or combinations thereof. In some embodiments, a method for forming the passivation layer 112 may include initially forming a passivation material layer (not shown) globally covering the interconnection structure 104 and the reflective patterns 110 by a deposition process (e.g., a CVD process), then performing a planarization process (e.g., a CMP process, an etching process or a combination thereof) on the passivation material layer to remove portions of the passivation material layer above the reflective patterns 110, to form the passivation layer 112. In these embodiments, the step S102 is followed by the step S104. In alternative embodiments, the step S104 precedes the step S102, and the passivation layer 112 having openings is initially formed, and the reflective patterns 110 are then formed in these openings. In these alternative embodiments, a method for forming the passivation layer 112 may include forming a passivation material layer (not shown) globally covering the interconnection structure 104 by a deposition process (e.g., a CVD process) or a solution process (e.g., a spin coating process), and then patterning the passivation material layer to form openings in the passivation material layer by a photolithography process and an etching process, to form the passivation layer 112. In addition, in these alternative embodiments, a method for forming the reflective patterns 110 may include filling the optically reflective and electrically conductive material into the openings of the passivation layer 112 by a deposition process (e.g., a PVD process), a plating process (e.g., an electroplating process or an electroless plating process) or a combination thereof, then performing a planarization process (e.g., a CMP process, an etching process or a combination thereof) to remove portions of this material above the passivation layer 112, so as to form the reflective patterns 110.

Figure 3B:
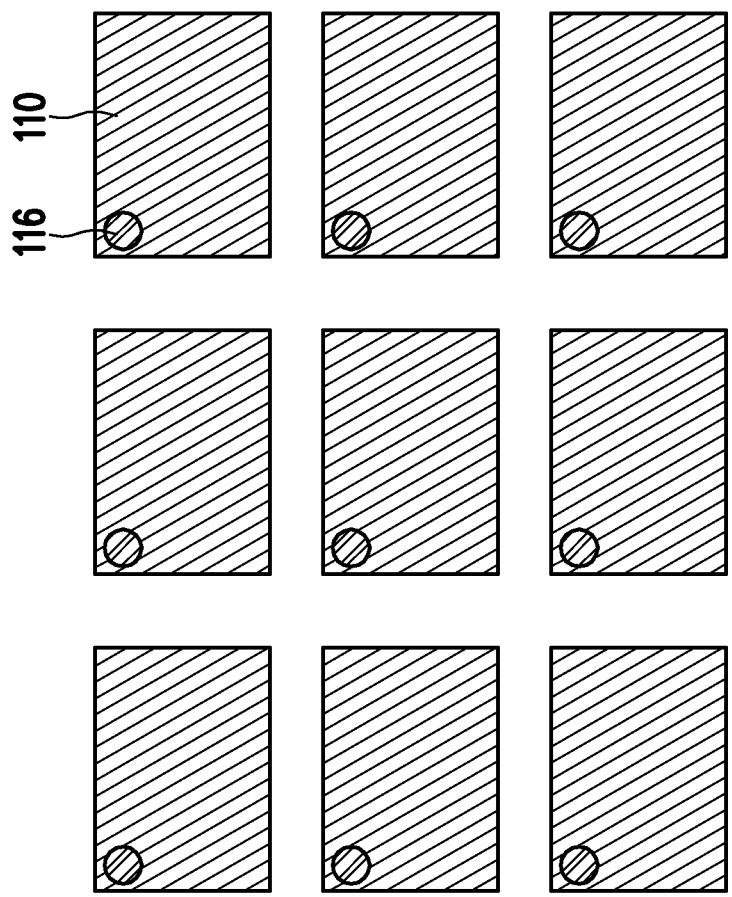

Referring to FIG. 1, FIG. 2D and FIG. 3B, step S106 is performed, and an insulating layer 114 and top conductive vias 116 are formed over the reflective patterns 110 and the passivation layer 112. The top conductive vias 116 penetrate through the insulating layer 114, and are in electrical contact with the reflective patterns 110, respectively. In some embodiments, the top conductive vias 116 further extend onto a top surface of the insulating layer 114. As shown in FIG. 3B, the top conductive vias 116 are respectively overlapped with one of the reflective patterns 110. For instance, the top conductive vias 116 may be located on corner regions of the reflective patterns 110. In addition, the top conductive vias 116 may have circular top view shapes. Those skilled in the art may modify dimensions, shapes and arrangement of the top conductive vias 116 according to process requirements, the present disclosure is not limited thereto. For instance, the top conductive vias 116 may be formed as having rectangular top view shapes in other embodiments. A material of the insulating layer 114 may include an optically transparent and electrically insulating material, such that the light generated by the subsequently formed electroluminescence devices (e.g., the electroluminescence devices in the optoelectronic module 120 to be described with reference to FIG. 2F) or reflected by the reflective patterns 110 can pass through the insulating layer 114, and the top conductive vias 116 can be electrically isolated from one another. For instance, the material of the insulating layer 114 may include silicon oxide, silicon nitride, silicon oxyniride, the like or combinations thereof.

On the other hand, a material of the top conductive vias 116 may be a conductive material, which may be unsusceptible to oxidation. Otherwise, the undesired oxide layer may result in compromise of conductivity of the conductive vias 116. In addition, if a pre-cleaning process is performed for removing such undesired oxide layer before the next process step, surface roughness of the conductive vias 116 and the insulating layer 114 may be raised, thus unwanted scattering of the light generated by the subsequently formed electroluminescence devices (e.g., the electroluminescence devices in the optoelectronic module 120 to be described with reference to FIG. 2F) may be increased. For instance, the conductive material for forming the top conductive vias 116 may include TiN, TiW, W, TaN, WN, the like or combinations thereof. In some embodiments, a method for forming the insulating layer 114 and the top conductive vias 116 may include initially forming an insulating material layer (not shown) globally covering the reflective patterns 110 and the passivation layer 112. Thereafter, openings respectively exposing a portion of one of the reflective patterns 110 are formed in the insulating material layer for forming the insulating layer 114 by a lithography process and an etching process, and a mask layer PR (e.g., a photoresist layer) is formed on the insulating layer 114. The mask layer PR has openings communicated with the openings of the insulating layer 114, and may be respectively larger than the openings of the insulating layer 114. Subsequently, the conductive material are filled into the openings of the insulating layer 114 and the openings of the mask layer PR to a predetermined height lower than a top surface of the mask layer PR by a deposition process (e.g., a PVD process), so as to form the top conductive vias 116. Once the top conductive vias 116 have been formed, the mask layer PR may be removed by, for example, a stripping process or an ashing process. Alternatively, the mask layer PR may be omitted, and the conductive material fills in the openings and globally covers the insulating layer 114 at the first place, then are patterned to form separate top conductive vias 116. In other embodiments, the insulating layer 114 and the top conductive vias 116 may be formed by using a damascene process. In these embodiments, the top conductive vias 116 may not extend onto the top surface of the insulating layer 114, and top surfaces of the top conductive vias 116 may be substantially coplanar with the top surface of the insulating layer 114.

Figure 3C:
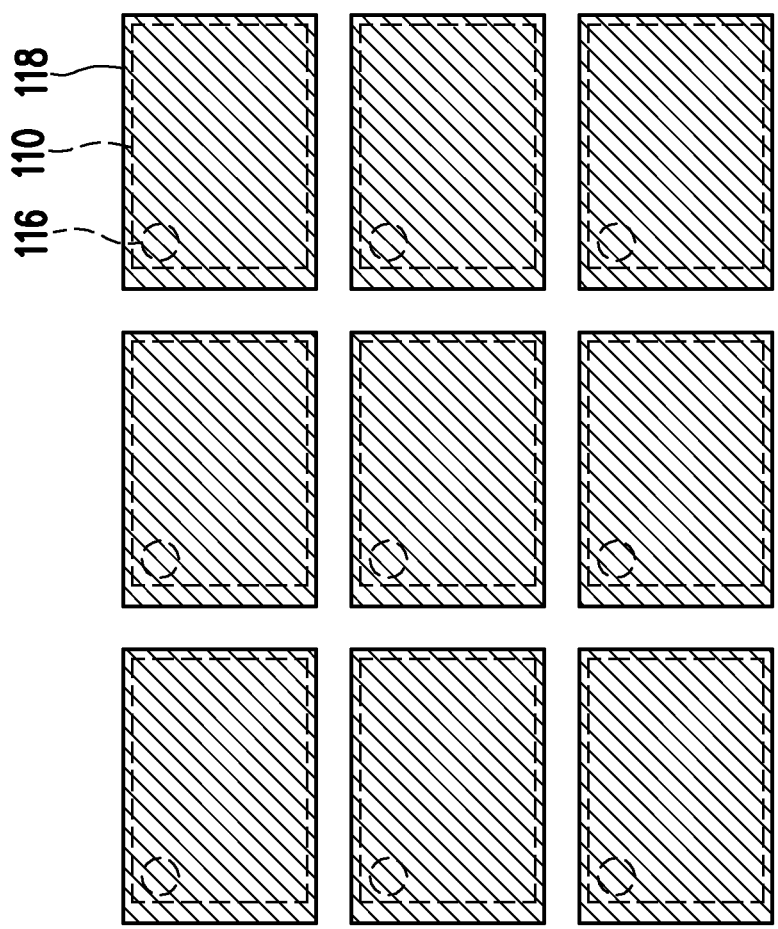

Referring to FIG. 1, FIG. 2E and FIG. 3C, step S108 is performed, and transparent conductive patterns 118 are formed. The transparent conductive patterns 118 are functioned as electrodes of the electroluminescence devices to be completed in the following steps (e.g., the electroluminescence devices in the optoelectronic module 120 to be described with reference to FIG. 2F). The transparent conductive patterns 118 are optically transparent and electrically conductive, such that the light generated by the optoelectronic devices and reflected by the reflective patterns 110 can pass through the transparent conductive patterns 118, and can be functioned as electrodes. In some embodiments, the transparent conductive patterns 118 may be functioned as anodes of the optoelectronic devices. The transparent conductive patterns 118 are disposed on the insulating layer 114, and respectively cover and electrically connect to one of the top conductive vias 116. In those embodiments where the top conductive vias 116 extend onto the top surface of the insulating layer 114, the transparent conductive patterns 118 may each conformally cover one of the top conductive vias 116. In some embodiments, as shown in FIG. 3C, the transparent conductive patterns 118 may be formed as patches (e.g., rectangular patches), and may be arranged in an array. Each of the patches is overlapped with the underlying top conductive via 116 and reflective pattern 110. In addition, the patches may have identical footprint area, or one of the patches may have a footprint area different from a footprint area of another one of the patches. In some embodiments, substantially the entire reflective pattern 110 is covered by the overlying transparent conductive pattern 118. In these embodiments, a footprint area of each transparent conductive pattern 118 may be greater than a footprint area of each reflective pattern 110. However, those skilled in the art may modify dimensions, shapes and arrangement of the transparent conductive patterns 118 according to process requirements, the present disclosure is not limited thereto.

Figure 4:
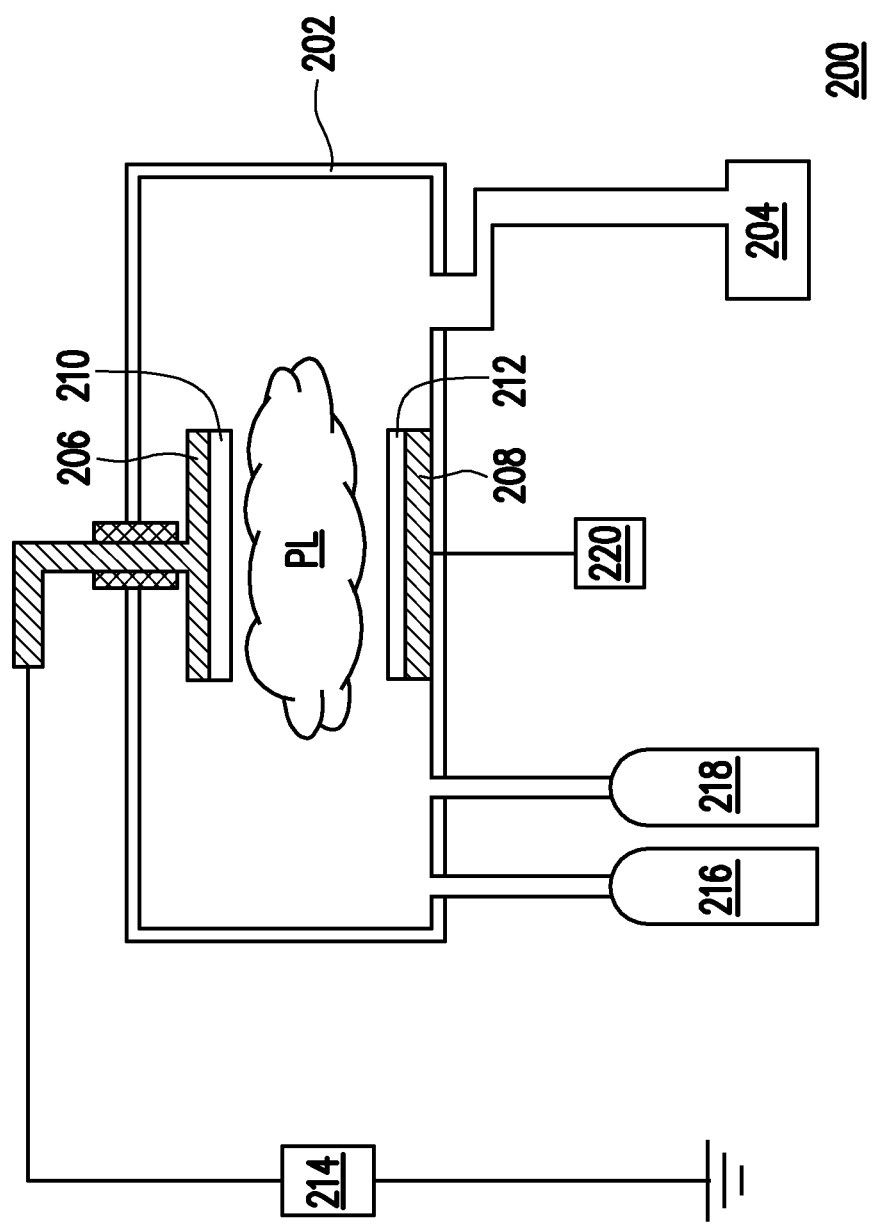
FIG. 4 is a schematic view illustrating a sputtering apparatus for forming transparent conductive patterns according to some embodiments of the present disclosure.

FIG. 4 is a schematic view illustrating a sputtering apparatus 200 for forming the transparent conductive patterns 118 according to some embodiments of the present disclosure.

Referring to FIG. 2E and FIG. 4, in some embodiments, a method for forming the transparent conductive patterns 118 includes initially forming a transparent conductive layer (not shown), and then patterning the transparent conductive layer by a lithography process and an etching process, so as to form the transparent conductive patterns 118. Once the transparent conductive patterns 118 have been formed, a mask layer (not shown) used in the lithography process and the etching process may be removed by a stripping process or an ashing process. In these embodiments, the transparent conductive layer may be deposited by a PVD process, such as a sputtering process. For instance, the sputtering process may be performed by using the sputtering apparatus 200 as shown in FIG. 4. The sputtering apparatus 200 includes a vacuum chamber 202. A vacuum pump 204 may be connected to the vacuum chamber 202 for controlling pressure in the vacuum chamber 202. A sputtering target holder 206 and a workpiece holder 208 are disposed in the vacuum chamber 202, for holding a sputtering target 210 and a workpiece 212 (e.g., the structure as shown in FIG. 2D without the mask layer PR), respectively. The sputtering target holder 206 may receive a high energy flux (e.g., a direct current (DC) power or a radio frequency (RF) power) provided by a power source 214 connected to the sputtering target holder 206 from outside the vacuum chamber 202. In addition, the sputtering target holder 206 may be configured to have a voltage bias with respect to the workpiece holder 208. Plasma source gas provided to a region between the sputtering target holder 206 and the workpiece holder 208 may be ionized by the high energy flux, so as to form plasma PL. The produced ions may strike the target 210, and some of the atoms of the target 210 may be knocked out and deposited at a surface of the workpiece 214. In certain cases, the ejected atom may react with reactive gas before arriving the workpiece 214, and the deposited material is a reaction product of the ejected atom and the reactive gas. The plasma source gas and the reactive gas may be provided by gas sources 216, 218 connected to the vacuum chamber 202, respectively. Moreover, temperature of the workpiece 212 during the sputtering process may be controlled by using a temperature controlling system 220 connected to the workpiece holder 208. For instance, the temperature controlling system 220 may include a heater.

In those embodiments where the sputtering apparatus 200 is used to form the transparent conductive layer for forming the transparent conductive patterns 118 as shown in FIG. 2E, the sputtering target 210 may be formed of a metal oxide material, which is also the material of the transparent conductive layer. However, certain compositional difference of the materials of the sputtering target 210 and the transparent conductive layer may be observed. On the other hand, the workpiece 212 may be the structure as shown in FIG. 2D but without the mask layer PR. In addition, the plasma source gas and the reactive gas may be Ar and $O_2$, respectively. The metal oxide material of the sputtering target 210 may include indium-based oxide, zinc-based oxide, tin-based oxide, the like or combinations thereof, and the metal oxide material may be doped with one or more of other metal elements such as Al, Ga, transition metal element(s) (e.g., Mo) or combinations thereof. Alternatively, the metal oxide material may be doped with a halogen element (e.g., F). In some embodiments, the metal oxide material of the sputtering target 210 and the transparent conductive layer includes indium tin oxide (ITO), Al-doped zinc oxide (AZO) or F-doped tin oxide (FTO). In those embodiments where the metal oxide material is ITO, a crystalline phase having a prefer growth plane rich in oxygen vacancy (e.g., (400) plane) in the transparent conductive layer may be increased by appropriately controlling temperature of the workpiece 212 during the sputtering process. The crystalline phase having such prefer growth plane (hereinafter, "oxygen-vacancy-rich crystalline phase") may be unsusceptible to In reduction reaction when the transparent conductive layer is in contact with or immersed in an electrolyte (e.g., duration a photoresist stripping process), since the charged oxygen vacancy ($VO^{2+}$) in the oxygen-vacancy-rich crystalline phase may result in enhancing reduction potential (i.e., lowering reduction tendency) of ITO. As a result of the reduction reaction, an optical transparency and/or material property (e.g., work function) of the formed transparent conductive patterns 118 may be altered, and optical performance of the to-be-completed electroluminescence devices (e.g., the electroluminescence devices in the optoelectronic module 120 to be described with reference to FIG. 2F) may be compromised. Such problem is particularly severe when the transparent conductive layer is deposited on a semiconductor substrate that has been subjected to a CMOS manufacturing process (e.g., the semiconductor substrate 100 being processed for forming the active devices 102 and the interconnection structure 104 thereon), since charges generated during the CMOS manufacturing process may be much more than charges generated during other manufacturing process, such as a thin film transistor (TFT) manufacturing process performed on a glass substrate. Therefore, increasing content of the oxygen-vacancy-rich crystalline phase in the transparent conductive layer may improve optical performance of the to-be-completed optoelectronic devices. In some embodiments, the temperature of the workpiece 212 is controlled during the sputtering process by heating the workpiece 212 to a temperature ranging from about 250° C. to about 350° C. via the temperature controlling system 220, so as to increase the oxygen-vacancy-rich crystalline phase in the deposited transparent conductive layer. In addition, the as-deposited transparent conductive layer may not be subjected to a post annealing process before the patterning process. Moreover, a ratio of a flow rate of the plasma source gas (e.g., Ar) with respect to a flow rate of the reactive gas (e.g., $O_2$) may range from 103 to 206, whereas a pressure in the vacuum chamber may range from 1 mTorr to 10 mTorr during the sputtering process. In these embodiments, the oxygen-vacancy-rich crystalline phase may be coexist with another crystalline phase having an oxygen-vacancy-poor prefer growth plane (e.g., (222) plane) in the deposited transparent conductive layer, of which a thickness is ranging from 50 Å to 2000 Å. The crystalline phase having the oxygen-vacancy-poor prefer growth plane will hereinafter be referred as an oxygen-vacancy-poor crystalline phase. A ratio of content of the oxygen-vacancy-rich crystalline phase with respect to content of the oxygen-vacancy-poor crystalline phase may be calculated from an X-ray diffraction pattern (e.g., from peak intensity of the X-ray diffraction pattern) of the transparent conductive layer, and may range from 0.3 to 0.5.

In alternative embodiments where the sputtering target 210 and the transparent conductive layer are respectively made of a metal oxide material other than ITO, a reduction reaction of the transparent conductive layer may also be avoided by forming the transparent conductive layer as having the oxygen-vacancy-rich crystalline phase. In addition, the transparent conductive layer may be formed by a sputtering process during which a thermal treatment is performed on the workpiece 212. Moreover, the oxygen-vacancy-rich crystalline phase and the oxygen-vacancy-poor crystalline phase may coexist in the transparent conductive layer. For instance, when the metal oxide material is AZO, the oxygen-vacancy-rich crystalline phase has a prefer growth plane of (200) plane, and the oxygen-vacancy-poor crystalline phase has a prefer growth plane of (220) plane. As another example, when metal oxide material is FTO, the oxygen-vacancy-rich crystalline phase has a prefer growth plane of (004) plane, and the oxygen-vacancy-poor crystalline phase has a prefer growth plane of (002) plane. Those skilled in the art may adjust the heating temperature, the flow rate ratio of the plasma source gas with respect the reactive gas, the pressure in the vacuum chamber 202 and/or other process parameters according to the selection of the metal oxide material, the present disclosure is not limited thereto.

Once the transparent conductive layer is deposited, a lithography process is performed on the transparent conductive layer. The lithography process includes forming a mask layer (not shown) on the transparent conductive layer, then performing an etching process by using the mask layer as a shadow mask to pattern the transparent conductive layer, so as to form the transparent conductive patterns 118 as shown in FIG. 2E. In some embodiments, the mask layer is then removed by a stripping process. In these embodiments, the transparent conductive patterns 118 are less susceptible to a reduction reaction as further having the oxygen-vacancy-rich crystalline phase. For instance, a difference of an optical transparency in visible spectrum of the transparent conductive layer and an optical transparency in visible spectrum of the transparent conductive patterns is less than 5%.

Referring to FIG. 1 and FIG. 2F, in some embodiments, step S110 is performed, and an optoelectronic module 120 is formed on the current structure. Some components in the optoelectronic module 120 and the underlying transparent conductive patterns 118 may collectively form electroluminescence devices (not shown). The transparent conductive patterns 118 may be respectively functioned as a bottom electrode of one of the electroluminescence devices. The electroluminescence devices may be respectively defined in a pixel region, and may be arranged as an array. Light produced by the electroluminescence devices may partially emit away from the semiconductor substrate 100, and partially emit toward the semiconductor substrate 100 and then reflected by the reflective patterns 110. The electroluminescence devices may be formed with various structures and various configurations. Those skilled in the art may select appropriate structure and configuration for the electroluminescence devices according to design and process requirements, the present disclosure is not limited thereto.

Up to here, a semiconductor device 10 has been completed. The semiconductor device 10 includes the semiconductor substrate 100 as well as the active devices 102, the interconnection structure 104 and the electroluminescence devices integrated on the semiconductor substrate 100. The electroluminescence devices include the transparent conductive patterns 118. Since content of the oxygen-vacancy-rich crystalline phase in the transparent conductive patterns 118 is increased (as compared to transparent conductive patterns merely having the oxygen-vacancy-poor crystalline phase), the metal oxide material in the transparent conductive patterns 118 is less susceptible to reduction reaction when the transparent conductive patterns 118 are in contact or immersed in an electrolyte (e.g., during a photoresist stripping process). Therefore, variation of optical transparency and/or other material properties (such as work function) of the transparent conductive patterns 118 during manufacturing process can be reduced. As such, optical performance (e.g., luminous efficacy) of the electroluminescence devices can be improved. In alternative embodiments, the electroluminescence devices may be replaced by, for example, an image sensor or the like, as long as the optoelectronic module 120 includes the transparent conductive patterns 118.

Figure 5A:
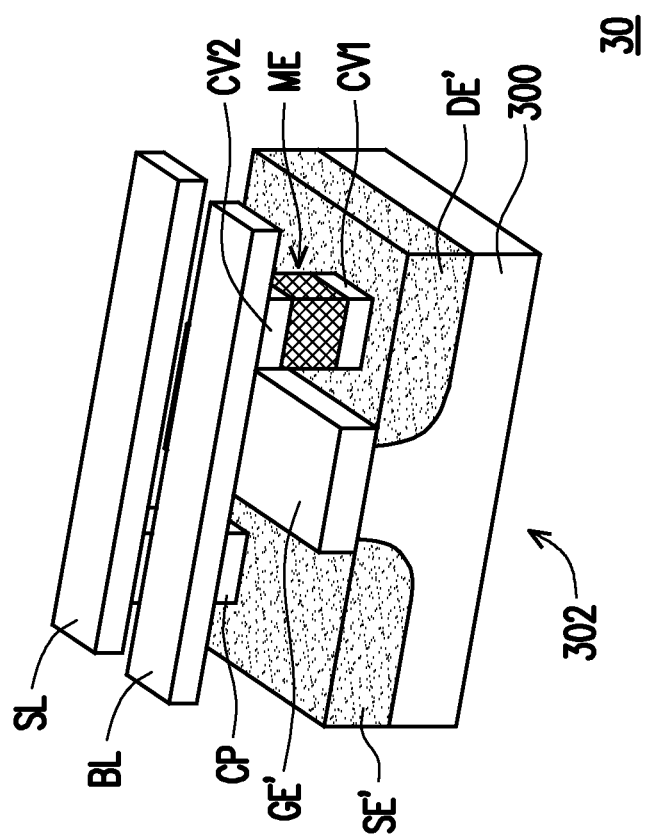
FIG. 5A is a schematic three-dimensional view illustrating a semiconductor device according to some embodiments of the present disclosure.
Figure 5B:
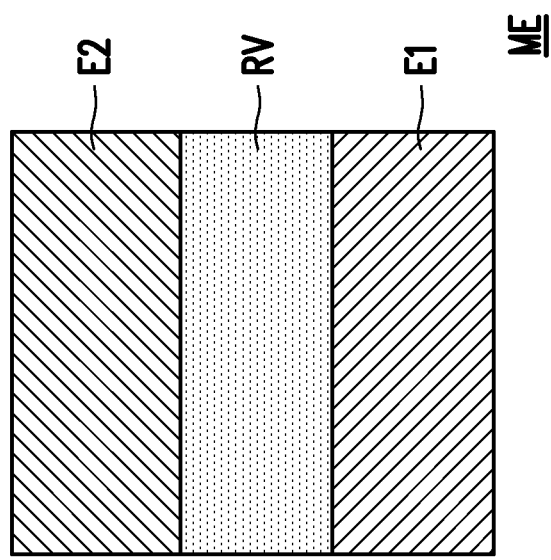
FIG. 5B is a cross-sectional view illustrating a storage element in the semiconductor device shown in FIG. 5A.

FIG. 5A is a schematic three-dimensional view illustrating a semiconductor device 30 according to some embodiments of the present disclosure. FIG. 5B is a cross-sectional view illustrating a storage element ME in the semiconductor device 30 shown in FIG. 5A.

Referring to FIG. 5A, in some embodiments, the semiconductor device 30 is a memory cell in a memory array (not shown). As similar to the semiconductor device 10 described with reference to FIG. 2A through FIG. 2F, the semiconductor device 30 also includes an active device 302 formed on a semiconductor substrate 300. In some embodiments, the active device 302 may be a MOS transistor, and uses a skin portion of the semiconductor substrate 300 as a channel region. In these embodiments, the active device 302 includes a gate electrode GE' and source and drain electrodes SE', DE'. It should be noted that, the semiconductor substrate 300 and components in the active device 302 shown in FIG. 5A are similar to the semiconductor substrate 100 and components in the active device 102 shown in FIG. 2A. Only differences therebetween will be described, the same or the like parts would not be repeated again. In addition, similar numeral/letter references indicate the same or similar components. Further, some components of the active device 302 including a gate dielectric layer (similar to the gate dielectric layer GD shown in FIG. 1A) and a spacer (similar to the spacer SP shown in FIG. 1A) are omitted from illustration. In some embodiments, the gate electrode GE' is formed in a linear shape, and may be shared by a column/row of the active devices 302. In these embodiments, the gate electrode GE' may also be referred as a word line.

The semiconductor device 30 may further include a memory element ME electrically connected to one of the source and drain electrodes SE', DE' of the active device 302. In some embodiments, the semiconductor device 30 is a memory cell in a resistive random access memory (RRAM) array. In these embodiments, the memory element ME may be a variable resistor. During a forming operation (or referred as a set operation), a voltage pulse is set across the memory element ME, and a conductive path is formed across the memory element ME. Accordingly, a resistance state of the memory element ME is changed to a low resistance state (LRS) from a high resistance state (HRS). On the other hand, during a reset operation, an opposite voltage is set across the memory element ME, such that the conductive path is cut off, and a resistance state of the memory element ME is changed to HRS from LRS. In some embodiments, the memory element ME is connected to one of the source and drain electrodes SE', DE' through a conductive via CV1 extending in between. In addition, the memory element ME may be connected to a bit line BL lying above the memory element ME through another conductive via CV2. In alternative embodiments, at least one of the conductive vias CV1, CV2 may be omitted. On the other hand, the other one of the source and drain electrodes SE', DE' that is not connected to the memory element ME may be electrically connected to a source line SL extending above the active device 302. In some embodiments, a contact plug CP may extend between the source line SL and the underlying source electrode SE' or drain electrode DE'.

Referring to FIG. 5A and FIG. 5B, in those embodiments where the semiconductor device 30 is a memory cell in a RRAM array, the memory element ME may include a bottom electrode E1, a top electrode E2 and a resistance variable layer RV sandwiched between the bottom electrode E1 and the top electrode E2. During a set operation, the resistance variable layer RV may be subjected to soft breakdown, and a conductive path (or referred as a "filament") may be formed in and penetrate through the resistance variable layer RV. Due to formation of the conductive path, the memory element ME may switch to LRS. On the other hand, during a reset operation, such conductive path may be cut off, and the memory element ME may switch back to HRS. In some embodiments, the bottom electrode E1 is a transparent conductive pattern, whereas the top electrode E2 may be made of a conductive material, such as Pt, TiN, TaN, W, Ag, Ti, Ru, Ni, Al, the like or combinations thereof. In addition, the resistance variable layer RV may be made of ZnO, $SiO_2$, $HfO_2$, $Gd:SiO_2$, $ZrO_2$, $Al_2O_3$, $Ta_2O_5$, $TiO_2$, SZO, other metal oxides, $SiO_2$ with metal doping, the like or combinations thereof. In these embodiments, the bottom electrode E1 is identical with the transparent conductive pattern 118 (shown in FIG. 2E) in terms of material and formation method (described with reference to FIG. 2E and FIG. 4). In other words, oxygen-vacancy-rich crystalline phase and oxygen-vacancy-poor crystalline phase can be both observed in the metal oxide of the bottom electrode E1, and the bottom electrode E1 can be less susceptible to reduction reaction when the bottom electrode E1 are in contact or immersed in an electrolyte. Therefore, variation of material properties (such as work function) of the bottom electrode E1 during manufacturing process can be reduced.

In alternative embodiments, materials for forming the bottom electrode E1 and the top electrode E2 are exchanged. In other words, the top electrode E2 is a transparent conductive pattern, whereas the bottom electrode E1 may be made of the afore-mentioned conductive material. In these alternative embodiments, the top electrode E2 is identical with the transparent conductive pattern 118 (shown in FIG. 2E) in terms of material and formation method (described with reference to FIG. 2E and FIG. 4). In other embodiments, the resistance variable layer RV is a transparent conductive pattern, whereas the bottom electrode E1 and the top electrode E2 may respectively be made of the afore-mentioned conductive material. In addition, the resistance variable layer RV is identical with the transparent conductive pattern 118 (shown in FIG. 2E) in terms of material and formation method (described with reference to FIG. 2E and FIG. 4).

As described above, the bottom electrode E1, the top electrode E2 or the resistance variable layer RV of the memory element ME may be formed by the material and method for forming the transparent conductive pattern 118 as described with reference to FIG. 2E and FIG. 4. Moreover, a memory array may include a plurality of the semiconductor devices 20, and the transparent conductive patterns of the memory elements ME in the semiconductor devices 20 may be arranged as an array.

Figure 6:
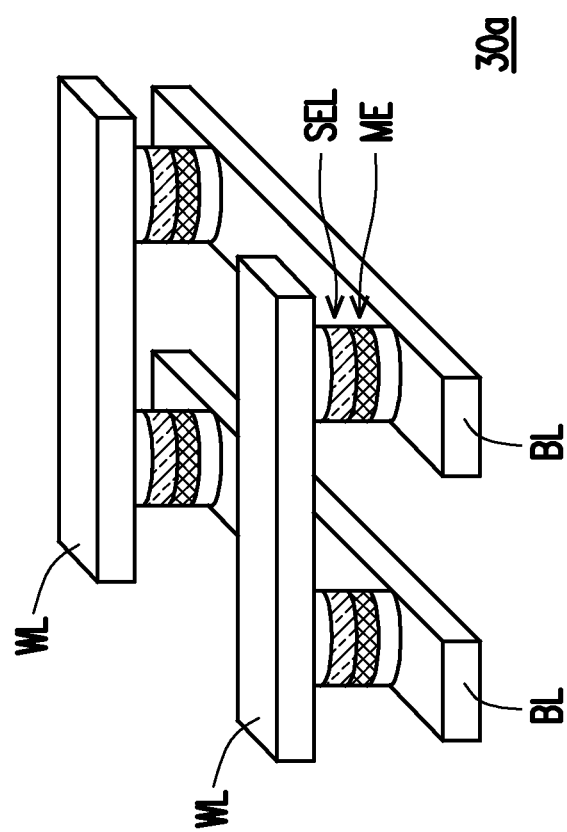
FIG. 6 is a schematic three-dimensional view illustrating a semiconductor device according to some embodiments of the present disclosure.

FIG. 6 is a schematic three-dimensional view illustrating a semiconductor device 30a according to some embodiments of the present disclosure. The semiconductor device 30a shown in FIG. 6 is similar to the semiconductor device 30 as described with reference to FIG. 5A and FIG. 5B. Only differences there between will be described, the same or the like parts would not be repeated again.

Referring to FIG. 6, a selector SEL is disposed to replace the MOS transistor (e.g., the active device 302 as described with reference to FIG. 5A). The selector SEL is a two-terminal device, such as an ovonic threshold switch (OTS) selector, a conductive bridge (CB) selector, a silicon-based selector, a metal-insulator-metal based selector, a threshold switching selectora, a metal-insulator transition (MIT) selector, a field assisted superlinear threshold (FAST) selector, a mixed ionic-electron conduction (MIEC) selector or the like. One of the terminals of the selector SEL is connected to a word line WL, which is formed on a semiconductor substrate (not shown). In addition, the other terminal of the selector SEL is connected to one of the terminals of the memory element ME as described with reference to FIG. 5A and FIG. 5B. Further, the other terminal of the memory element ME is connected to a bit line BL. Accordingly, the selector SEL and the memory element ME are disposed between and electrically connected to the word line WL and the bit line BL. The selector SEL and the memory element ME may collectively constitute a memory cell, and a memory array may include a plurality of such memory cells.

As above, the semiconductor device according to embodiments of the present disclosure includes a semiconductor substrate and transparent conductive patterns formed on the semiconductor substrate. In some embodiments, the semiconductor device is an integration of electroluminescence devices and CMOS circuit, and the transparent conductive patterns may be functioned as electrodes of the electroluminescence devices. Further, oxygen-vacancy-rich crystalline phase and oxygen-vacancy-poor crystalline phase coexist in the transparent conductive patterns. As compared to transparent conductive patterns solely include the oxygen-vacancy-poor crystalline phase, the transparent conductive patterns according to embodiments of the present disclosure are less susceptible to reduction reaction when the transparent conductive patterns are in contact with or immersed in an electrolyte. Therefore, variation of optical transparency and/or other material properties of the transparent conductive patterns during manufacturing process can be reduced, and optical performance of the electroluminescence devices can be improved. In other embodiments, the transparent conductive patterns can be used in memory devices, and may also have low tendency toward a reduction reaction.

In an aspect of the present disclosure, a semiconductor device is provided. The semiconductor device comprises: a semiconductor substrate; active devices, formed on the semiconductor substrate; and transparent conductive patterns, formed over the active devices, and electrically connected to the active devices, wherein the transparent conductive patterns are made of a metal oxide material, the metal oxide material has a first crystalline phase with a first oxygen vacancy content, and has a second crystalline phase with a second oxygen vacancy content less than the first oxygen vacancy content.

In another aspect of the present disclosure, a semiconductor device is provided. The semiconductor device comprises: a semiconductor substrate; active devices, formed on the semiconductor substrate; an interconnection structure, covering the semiconductor substrate and the active devices, wherein the active devices are electrically connected to the interconnection structure; reflective patterns, formed on the interconnection structure, and electrically connected to the interconnection structure; and electroluminescence devices, disposed on the reflective pattern, and respectively comprising a transparent conductive pattern, the transparent conductive patterns are made of a metal oxide material, the metal oxide material has a first crystalline phase with a first oxygen vacancy content, and has a second crystalline phase with a second oxygen vacancy content less than the first oxygen vacancy content.

In yet another aspect of the present disclosure, a manufacturing method of a semiconductor device is provided. The method comprises: providing a semiconductor substrate; forming active devices on the semiconductor substrate; and performing a sputtering process to form a transparent conductive layer over the active devices, wherein the semiconductor substrate formed with the active devices is heated during the sputtering process, such that the deposited transparent conductive layer has a first crystalline phase with a first oxygen vacancy content, and has a second crystalline phase with a second oxygen vacancy content less than the first oxygen vacancy content.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
active devices, formed on the semiconductor substrate; and
transparent conductive patterns, formed over the active devices, and electrically connected to the active devices, wherein the transparent conductive patterns are made of a metal oxide material, the metal oxide material has a first crystalline phase with a first oxygen vacancy content, and has a second crystalline phase with a second oxygen vacancy content less than the first oxygen vacancy content.

2. The semiconductor device according to claim 1, wherein the metal oxide material includes aluminum-doped zinc oxide, a prefer growth plane of the first crystalline phase is a (200) plane, and a prefer growth plane of the second crystalline phase is a (220) plane.

3. The semiconductor device according to claim 1, wherein the metal oxide material includes fluorine-doped tin oxide, a prefer growth plane of the first crystalline phase is a (004) plane, and a prefer growth plane of the second crystalline phase is a (002) plane.

4. The semiconductor device according to claim 1, wherein the transparent conductive patterns are formed as patches, and arranged in an array over the active devices.

5. The semiconductor device according to claim 1, wherein the transparent conductive patterns are respectively a portion of an electroluminescence device.

6. The semiconductor device according to claim 1, wherein the transparent conductive patterns are respectively a portion of a memory element in a resistive random access memory (RRAM) device.

7. The semiconductor device according to claim 1, wherein the metal oxide material includes indium tin oxide, a prefer growth plane of the first crystalline phase is a (400) plane, and a prefer growth plane of the second crystalline phase is a (222) plane.

8. The semiconductor device according to claim 7, wherein a ratio of a content of the first crystalline phase in the metal oxide material with respect to a content of the second crystalline phase in the metal oxide material ranges from 0.3 to 0.5.

9. A semiconductor device, comprising:
a semiconductor substrate;
active devices, formed on the semiconductor substrate;
an interconnection structure, covering the semiconductor substrate and the active devices, wherein the active devices are electrically connected to the interconnection structure;
reflective patterns, formed on the interconnection structure, and electrically connected to the interconnection structure; and
electroluminescence devices, disposed on the reflective pattern, and respectively comprising a transparent conductive pattern, the transparent conductive patterns are made of a metal oxide material, the metal oxide material has a first crystalline phase with a first oxygen vacancy content, and has a second crystalline phase with a second oxygen vacancy content less than the first oxygen vacancy content.

10. The semiconductor device according to claim 9, wherein the active devices comprise metal-oxide-semiconductor (MOS) transistors.

11. The semiconductor device according to claim 9, further comprising capacitors, embedded in the interconnection structure.

12. The semiconductor device according to claim 11, wherein each of the electroluminescence devices is driven by at least one of the active devices and at least one of the capacitors.

13. The semiconductor device according to claim 9, further comprising conductive vias, respectively in electrical contact with and located between one of the reflective patterns and one of the electroluminescence devices.

14. The semiconductor device according to claim 13, wherein the conductive vias are overlapped with corner portions of the reflective patterns.

15. A manufacturing method of a semiconductor device, comprising:
providing a semiconductor substrate;
forming active devices on the semiconductor substrate; and
performing a sputtering process to form a transparent conductive layer over the active devices, wherein the semiconductor substrate formed with the active devices is heated during the sputtering process, such that the deposited transparent conductive layer has a first crystalline phase with a first oxygen vacancy content, and has a second crystalline phase with a second oxygen vacancy content less than the first oxygen vacancy content.

16. The manufacturing method of the semiconductor device according to claim 15, wherein the semiconductor substrate formed with the active devices is heated to a temperature from 250° C. to 350° C. during the sputtering process.

17. The manufacturing method of the semiconductor device according to claim 15, wherein the transparent conductive layer is not subjected to a post-deposition annealing process.

18. The manufacturing method of the semiconductor device according to claim 15, wherein a material of a sputtering target used in the sputtering process and a material of the transparent conductive layer respectively include a metal oxide material.

19. The manufacturing method of the semiconductor device according to claim 15, further comprising: patterning the transparent conductive layer to form separated transparent conductive patterns.

20. The manufacturing method of the semiconductor device according to claim 17, wherein a difference of an optical transparency in visible spectrum of the transparent conductive layer and an optical transparency in visible spectrum of the transparent conductive patterns is less than 5%.

* * * * *